US012633645B2

(12) United States Patent
Landesberger et al.

(10) Patent No.: US 12,633,645 B2
(45) Date of Patent: May 19, 2026

(54) ANTENNA MODULE

(71) Applicant: Fraunhofer-Gesellschaft zur Förderung der angewandten Forschung e.V., Munich (DE)

(72) Inventors: Christof Landesberger, Munich (DE); Peter Ramm, Munich (DE); Nagarajan Palavesam, Munich (DE); Josef Weber, Munich (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 17/156,818

(22) Filed: Jan. 25, 2021

(65) Prior Publication Data

US 2021/0234256 A1     Jul. 29, 2021

(30) Foreign Application Priority Data

Jan. 28, 2020     (DE) ..................... 10 2020 200 974.0

(51) Int. Cl.
H01Q 1/22          (2006.01)
H01Q 1/02          (2006.01)
          (Continued)

(52) U.S. Cl.
CPC ............. H01Q 1/2283 (2013.01); H01Q 1/02 (2013.01); H01Q 1/405 (2013.01);
          (Continued)

(58) Field of Classification Search
CPC ........ H01Q 1/2283; H01Q 1/02; H01Q 1/405; H01Q 15/0006; H01Q 15/0086;
          (Continued)

(56) References Cited

U.S. PATENT DOCUMENTS 6,087,989 A     7/2000  Song et al.
10,325,850 B1 *  6/2019  Convert ............... H01Q 1/2283
          (Continued)

FOREIGN PATENT DOCUMENTS

CN          103367909 A     10/2013
CN          103618138 A     3/2014
          (Continued)

OTHER PUBLICATIONS

Extended European Search Report dated Jun. 22, 2021, issued in application No. EP 21153586.9.
          (Continued)

*Primary Examiner* — Robert Karacsony
(74) *Attorney, Agent, or Firm* — McClure, Qualey & Rodack, LLP

(57)          ABSTRACT

An antenna module includes a first substrate, a second substrate, the second substrate including at least one cavity at one of the first main surface. The first substrate includes at least an RF antenna element and/or an RF chip and/or an RF conductive trace, which are arranged on the first main surface of the substrate. The first substrate is connected, with its first main surface, to the first main surface of the second substrate so that the RF elements project into the at least one cavity.

16 Claims, 8 Drawing Sheets

100

(51) Int. Cl.

| | |
|---|---|
| *H01Q 1/40* | (2006.01) |
| *H01Q 15/00* | (2006.01) |
| *H01Q 19/10* | (2006.01) |
| *H01Q 23/00* | (2006.01) |
| *H10W 20/42* | (2026.01) |
| *H10W 40/70* | (2026.01) |
| *H10W 42/00* | (2026.01) |
| *H10W 44/20* | (2026.01) |
| *H10W 70/692* | (2026.01) |
| *H10W 70/698* | (2026.01) |
| *H10W 76/01* | (2026.01) |
| *H10W 76/153* | (2026.01) |
| *H10W 99/00* | (2026.01) |

(52) U.S. Cl.
   CPC ..... *H01Q 15/0006* (2013.01); *H01Q 15/0086* (2013.01); *H01Q 19/10* (2013.01); *H01Q 23/00* (2013.01); *H10W 20/42* (2026.01); *H10W 40/70* (2026.01); *H10W 42/00* (2026.01); *H10W 44/20* (2026.01); *H10W 70/692* (2026.01); *H10W 70/698* (2026.01); *H10W 76/01* (2026.01); *H10W 76/153* (2026.01); *H10W 99/00* (2026.01); *H10W 44/216* (2026.01); *H10W 44/248* (2026.01)

(58) Field of Classification Search
   CPC ...... H01Q 19/10; H01Q 23/00; H01L 21/481; H01L 21/4803; H01L 21/4817; H01L 23/055; H01L 23/66; H01L 23/147; H01L 23/5226; H01L 23/15; H01L 23/42; H01L 23/564; H01L 2223/6677; H01L 2223/6627
   See application file for complete search history.

(56) References Cited

U.S. PATENT DOCUMENTS

| | | | |
|---|---|---|---|
| 2004/0058476 A1 | 3/2004 | Enquist et al. | |
| 2006/0278967 A1 | 12/2006 | Tuominen et al. | |
| 2008/0029886 A1 | 2/2008 | Cotte et al. | |
| 2009/0256752 A1 | 10/2009 | Akkermans et al. | |
| 2010/0327068 A1 | 12/2010 | Chen et al. | |
| 2011/0032685 A1 | 2/2011 | Akiba et al. | |
| 2012/0119969 A1* | 5/2012 | MacDonald | H01L 23/66 |
| | | | 343/841 |
| 2012/0280380 A1 | 11/2012 | Kamgaing | |
| 2014/0091406 A1 | 4/2014 | Harney et al. | |
| 2014/0225795 A1 | 8/2014 | Yu | |
| 2016/0233178 A1* | 8/2016 | Lamy | H01Q 15/008 |
| 2017/0025362 A1 | 1/2017 | Nguyen et al. | |
| 2017/0062357 A1 | 3/2017 | Kamgaing et al. | |
| 2017/0125895 A1 | 5/2017 | Baks et al. | |
| 2017/0125916 A1 | 5/2017 | Camacho | |
| 2017/0236764 A1 | 8/2017 | Ho | |
| 2018/0006358 A1 | 1/2018 | Gottwald et al. | |
| 2018/0212307 A1 | 7/2018 | Kim et al. | |
| 2019/0139915 A1 | 5/2019 | Dalmia et al. | |
| 2019/0252772 A1* | 8/2019 | Ndip | H01Q 1/02 |
| 2019/0319349 A1 | 10/2019 | Loeher et al. | |
| 2020/0058998 A1 | 2/2020 | Kirknes | |
| 2020/0161766 A1 | 5/2020 | Liu et al. | |
| 2020/0258845 A1 | 8/2020 | Nguyen et al. | |

FOREIGN PATENT DOCUMENTS

| | | |
|---|---|---|
| CN | 205564982 U | 9/2016 |
| CN | 107039743 A | 8/2017 |
| CN | 107579342 A | 1/2018 |
| CN | 108183342 A | 6/2018 |
| CN | 108879114 A | 11/2018 |
| CN | 109309276 A | 2/2019 |
| CN | 110431714 A | 11/2019 |
| EP | 2 469 592 A1 | 6/2012 |
| EP | 3346549 A1 | 7/2018 |
| FR | 3 016 988 A1 | 7/2015 |
| KR | 10-0207600 B1 | 7/1999 |
| KR | 10-2006-0005348 A | 1/2006 |
| KR | 10-2011-0005250 A | 1/2011 |
| TW | 201433003 A | 8/2014 |
| TW | 201709445 A | 3/2017 |
| TW | I655740 B | 4/2019 |
| TW | 201921627 A | 6/2019 |
| WO | 2019/020795 A1 | 1/2019 |

OTHER PUBLICATIONS

Beer, S., et al.; "Integrated 122-GHz Antenna on a Flexible Polyimide Substrate With Flip Chip Interconnect;" IEEE Transactions on Antennas and Propagation, vol. 61, No. 4, Apr. 2013, pp. 1564-1572.

Chinese language office action dated Dec. 17, 2021, issued in application No. TW 110103127.

E. Topak et al., "Broadband interconnect design for silicon-based system-in-package applications up to 170 GHz," 2013 European Microwave Conference, Nuremberg, Germany, 2013, pp. 116-119.

Hoivik, Nils & Liu, Duixian & Jahnes, C. & Cotte, J.M. & Tsang, Cornelia & Patel, C. & Pfeiffer, Ullrich & Grzyb, J. & Knickerbocker, J. & Magerlein, J.H. & Gaucher, B.. (2007). High-efficiency 60 GHZ antenna fabricated using low-cost silicon micromachining techniques. IEEE Antennas and Propagation Symposium. 5043-5046. 10.1109/APS.2007.4396679.

Korean language office action dated Dec. 23, 2022, issued in application No. KR 10-2021-0012307.

English language translation of office action dated Dec. 23, 2022, issued in application No. KR 10-2021-0012307 (pp. 1-5 of attachment).

Chinese language office action dated Jun. 16, 2023, issued in application No. TW 110103127.

English language translation of office action dated Jun. 16, 2023 (pp. 1-13 of attachment).

Chinese language office action dated Aug. 31, 2023, issued in application No. CN 202110122017.4.

Translation of office action dated Aug. 31, 2023 (pp. 1-9 of attachment).

CN Office Action dated Apr. 12, 2024 in Chinese application No. 202110122017.4.

Chinese language notice of allowance dated Sep. 26, 2024, issued in application No. CN 202110122017.4.

English language translation of notice of allowance dated Sep. 26, 2024(pp. 5-6 of attachment).

* cited by examiner

ANTENNA MODULE

CROSS-REFERENCE TO RELATED APPLICATION

This application claims priority from German Patent Application No. DE 10 2020 200 974.0, which was filed on Jan. 28, 2020, and is incorporated herein in its entirety by reference.

BACKGROUND OF THE INVENTION

Embodiments of the present invention relate to an antenna module and to a corresponding manufacturing method. Advantageously embodiments relate to a 3D glass wafer RF package. Further advantageous embodiments relate to a method of manufacturing a package for a high-frequency chip (RF chip, radio frequency chip) equipped with an antenna for emitting and/or receiving radio waves or microwaves.

With high frequencies, in particular within the RADAR range, of more than 60 GHz up to THz (mm waves), there are a number of electrotechnical requirements that may be met in order to implement a high-performance chip antenna system which produces as little power dissipation (waste heat) as possible; these include avoiding inductances in the conductive traces between the antenna and the RF chip; i.e., e.g., avoiding the gold wire bonds, which are typically used, on the chip pads since those bonding wires represent half a "loop" of a conductive-trace turn and, thus, an inductance which generates losses.

as short conductive-trace paths as possible, i.e., e.g., an integrated package of chip and antenna.

precise geometrical definition (if possible, within the micrometer range) of all materials, layer thicknesses, conductive traces and insulators within the package. It is only then that manufacturing technology corresponds very well with previously performed RF simulations. Also, the package should not deform when acted on by heat since otherwise there will again be deviations from the desired RF characteristic.

So that RF signals can be transmitted without loss as much as possible, the surrounding, electrically insulating dielectric is to exhibit as low a dielectric constant (permittivity) as possible so as to minimize straight capacitances.

In conventional technology, several approaches to avoiding wire bond contacts have been known: flip-chip bonding on a substrate (PCB or silicon wafer) and embedding technologies, wherein an RF chip is buried in a cavity of an Si wafer and wherein subsequently, quasi planar contacting with the chip is implemented on the front side of the wafer.

Please refer to the following publications within this context:

EP 3 346 549 A1 describes a module having an integrated antenna. Please also refer to the publications entitled "Broadband Interconnect Design for Silicon-Based System-in-Package Applications up to 170 GHZ" and entitled "High-Efficiency 60 GHz Antenna Fabricated Using Low-Cost Silicon Micromachining Techniques".

Also, it is known that the RF antenna may be configured in the form of a cavity filled with air and that an RF signal line is led to the center via the cavity.

What is disadvantageous about these known concepts is that the conductive-trace land located above the antenna cavity comprises no mechanical fixing if the cavity is to be filled with air. If the conductive-trace land is fixed only via a coating (e.g., polymer or foil), any mechanical deflection of the land will result in a change in the radiation pattern. A further disadvantage in conventional technology is that the top side of the wafer which has the RF chips embedded therein is open toward the environment; i.e., it still does not represent a safe or hermetic package.

Therefore, there is a need for an improved approach, wherein, in particular, the above-described disadvantages are avoided in the integration.

SUMMARY

According to an embodiment, an antenna module may have: a first substrate, a second substrate, said second substrate including at least one cavity at a first main surface, wherein the first substrate includes at least an RF antenna element and/or an RF chip and/or an RF conductive trace, the RF antenna element and/or the RF chip and/or the RF conductive trace being arranged on or in a first main surface of the first substrate, wherein the RF antenna element and/or the RF chip and/or the RF conductive trace project(s) out of the first main surface and/or into the at least one cavity, the first substrate being a high-resistance substrate, an insulating substrate and/or including a glass material, a ceramic material or a polymer material, the cavity including an electrically contacted cavity metallization having a reduced width.

According to another embodiment, a method of manufacturing an antenna module may have the steps of: providing a first substrate; providing a second substrate, said second substrate including at least one cavity at a first main surface, wherein the first substrate includes at least an RF antenna element and/or an RF chip and/or an RF conductive trace, the RF antenna element and/or the RF chip and/or the RF conductive trace being arranged on a first main surface of the first substrate; and connecting the first substrate, with its first main surface, to the first main surface of the second substrate so that the RF antenna element and/or the RF chip and/or the RF conductive trace project(s) out of the first main surface and/or into the at least one cavity, the first substrate being a high-resistance substrate, an insulating substrate and/or including a glass material, a ceramic material or a polymer material, the cavity including an electrically contacted cavity metallization having a reduced width.

Embodiments of the present invention provide an antenna module having a first (e.g., insulating) substrate, a second substrate which has at least one cavity on a first main surface of the second substrate. Within this context, the first substrate comprises at least an RF element, an RF chip and/or an RF conductive trace. The RF antenna element, the RF chip and/or the RF conductive trace is arranged/formed on or within the first main surface of the first substrate. The first substrate is connected, e.g., with its first main surface, to the first main surface of the second substrate such that the RF element and/or the RF chip and/or the RF conductive trace are aligned to be flush, or to overlap with at least one cavity, and/or such that the RF antenna element and/or the RF chip and/or the RF conductive trace projects out of the first main surface and/or into the at least one cavity.

In accordance with advantageous embodiments, the RF antenna element and/or the RF chip and/or the RF conductive trace are configured such that same projects out of the first main surface of the first substrate and/or into the at least one cavity. Embodiments of the present invention are based on the finding that the RF chip (assembly) and/or the RF conductive traces may be performed on a (high-resistance) substrate (without any loss of generality, e.g., a glass wafer or ceramic wafer or polymer wafer). By placing, in an adjusted manner, a silicon wafer or, generally, a further substrate onto the substrate populated with the RF chips and/or RF conductive traces, an RF package may be provided. In accordance with embodiments, said placement in an adjusted manner is provided by means of adhering or bonding, for example. As was already mentioned above, the further substrate (silicon wafer) comprises one or more cavities. In accordance with embodiments, said cavities may have the RF elements such as the RF chip (which is mounted on the surface of the substrate) vertically "buried" therein. Moreover, by means of interaction of the RF antenna element with a cavity, a so-called cavity antenna may be formed. Said RF package advantageously meets requirements with regard to stability, hermeticity and with regard to radiation properties, which results, e.g., from the possibility of perforating one or more substrates.

In accordance with embodiments, the second substrate may comprise a conductive trace, a conductive trace arranged on the first main surface, or a conductive trace within the cavity and/or on the bottom of the cavity. In accordance with embodiments, the substrate may comprise either RF conductive traces or conductive traces in general. Therefore, the new idea is generally based on a 3D substrate stack consisting of a substrate (e.g., glass) and an Si substrate, there being electrical connecting paths on and between the two stacked substrates. The vertical connecting paths may be implemented, without any loss of generality, by means of substrate through-connections (e.g., in the case of an Si substrate by means of through-Si vias (TSV). As far as that goes, in accordance with further embodiments, also the further substrate may comprise conductive traces both on the first main surface and/or on the sides of the first main surface or on the sides of the oppositely located second main surfaces. Said through-connection may be effected, e.g., by means of vias, e.g., TSV (through-silicon via).

In the above embodiments, it was assumed that the RF elements (RF antenna element, RF chip and/or RF conductive trace) are mounted onto or into the substrate. Here, in accordance with embodiments, the respective RF element(s) may project out of the main surface and/or into the at least one cavity. In accordance with further embodiments, it would also be feasible for several cavities to be provided which are associated with different RF elements.

With regard to the cavities, it shall be noted that they may generally be filled with air, gas, and a vacuum. In accordance with further embodiments, the cavity, or generally, the antenna module may comprise a so-called meta material arranged, e.g., within the cavity and/or on the bottom of the cavity. The meta material may be associated with the RF antenna element, i.e., may be arranged within the cavity belonging to the RF antenna element. Advantageously, the meta material improves the radiation pattern of the antenna element. In accordance with further embodiments, a thermal element may also be provided. Said thermal element is provided, e.g., within a cavity or on the bottom of the cavity. The thermal element may be associated with the RF chip and thus improves temperature dissipation.

With regard to the substrates, it shall be noted that the second substrate may be formed, e.g., by a substrate stack. For example, here a substrate such as a silicon substrate having openings, for example, is provided, which is closed off by a so-called lid element, or lid substrate. In accordance with embodiments, the lid substrate may be a substrate. Generally, the substrate stack may comprise an insulating substrate. In general, it shall be noted with regard to the second substrate that the latter is advantageously a semiconductor substrate such as a silicon substrate, for example.

Conversely, the substrate is, e.g., a substrate consisting of a glass material, a ceramic material or a polymer material. Said types of material exhibit advantages with regard to the RF antenna properties. In accordance with embodiments, said substrate may also be a thinned substrate. Within this context, for example, the substrate is thinned once it has been adhered with the second substrate.

This advantageously improves the properties with regard to the antenna module's ability to be integrated.

A further embodiment provides a manufacturing method. The method includes the following steps:

providing a first (high-resistance or insulating) substrate;

providing a second substrate, the second substrate comprising at least one cavity at a first main surface; the first substrate comprising at least an RF antenna element and/or an RF chip and/or an RF conductive trace, the antenna element and/or the RF chip and/or the RF conductive trace being arranged on a first main surface of the first substrate; and connecting the first substrate, with its main surface, to the first main surface of the second substrate, so that the RF antenna element and/or the RF chip and/or the RF conductive trace projects out of the first main surface and/or into the at least one cavity.

In accordance with a further embodiment, said connecting may be effected by means of flip-chip technologies, or "face-to-face wafer bonding".

In accordance with one embodiment, said providing may be preceded by patterning, such as etching, dry etching, for example, of the second substrate so as to incorporate the at least one cavity into the first main surface. Here, conventional semiconductor manufacturing methods are employed. In accordance with further embodiments, the step may also comprise providing and/or incorporating electric conductive traces or other elements such as the thermal element or the meta material, for example. In accordance with an embodiment, providing the first substrate and/or the second substrate may be preceded by one or more semiconductor manufacturing steps so as to apply an RF element, an RF conductive trace, a meta material, a thermal material, an RF conductive trace, an RF chip and/or an RF antenna element onto the first and/or second substrate(s).

In accordance with further embodiments, it would be feasible that thinning of the first substrate is effected after the connecting step. Following the connecting step, the substrate exhibits sufficient stability for the material to be thinned. In addition, thinning of the second substrate may also be effected, e.g., in order to open the cavities from the rear side. Closing may then be effected by a further substrate. Within this context, a layer stack will then be formed instead of the second substrate.

BRIEF DESCRIPTION OF THE DRAWINGS

Embodiments of the present invention will be detailed subsequently referring to the appended drawings, in which:

FIG. 2b shows a schematic representation of the device component in cross-section in an assembled form in accordance with the embodiment of FIG. 2a;

DETAILED DESCRIPTION OF THE INVENTION

Figure 1:
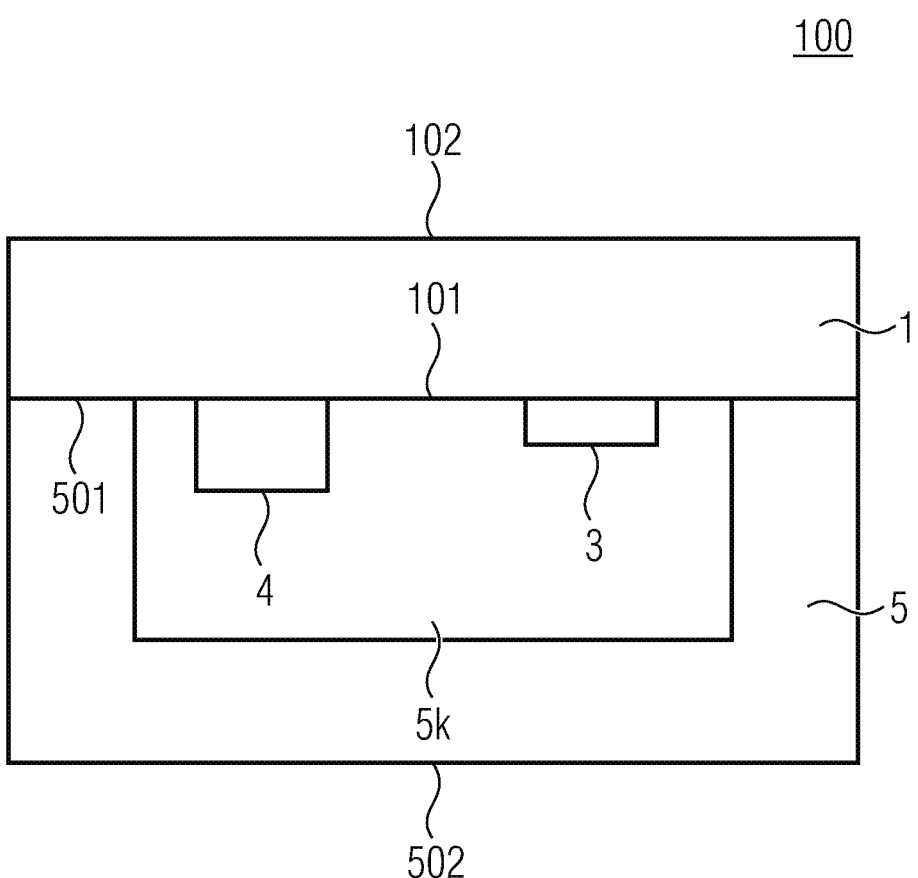
FIG. 1 shows a schematic representation of an antenna module in accordance with a basic embodiment.

Embodiments of the present invention will be explained below with reference to the figures. Here, identical reference numerals will be used for identical elements and structures, so that their descriptions are mutually applicable, or interchangeable.

FIG. 1 shows an antenna module 100 comprising a first substrate 1 as well as a second substrate 5. For example, the first substrate is a high-resistance or electrically insulating substrate which may comprise a glass, a ceramic or a glass ceramic. The second substrate 5 may be a semiconductor substrate, for example. The substrates are connected to each other via first main surfaces 101 and 501, respectively, by means of flip-chip or face-to-face wafer bonding. The oppositely located second main surfaces 1*o*2 and 5*o*2 are the outwardly directed main surfaces of the module 100.

On the first main surface 1*o*1, the first substrate 1 comprises at least an RF element. By way of example, two RF elements, namely an RF chip 4 and an RF antenna 3, are shown here. In accordance with embodiments, they may be formed in the main surface 1*o*1, or they may be formed on the main surface 1*o*1, as depicted here.

The substrate 5 comprises a cavity 5*k* provided on the sides of the first main surface 5*o*1. The cavity 5*k* enables the substrates 1 and 5 to be connected via their main surfaces 1*o*1 and 5*o*1 despite the one or more RF elements 3 and 4. To this end, the elements 3 and 4 project into the cavity 5*k*. From a lateral point of view, the elements 3 and 4 are associated, to this end, with the at least one cavity 5*k*, so that the elements 3 and 5 will be aligned to be lateral to the cavity following connection of the substrates. As depicted, the elements 3 and 5 project out of the main surface 1*o*1 and into the cavity 5*k*. To this end, the cavity is adapted, e.g. in terms of its depth, to the height of the elements 3 and 4.

As depicted in FIG. 1, the antenna module 100 will be formed by a package including a stack of substrates, e.g., the insulating substrate 1 and the further substrate 5 (e.g., silicon substrate). Utilization of the insulating substrate, e.g., glass, is advantageous because it is permeable to radio waves. In addition, glass wafers 1 may be processed, in semiconductor manufacturing lines, by means of the known methods of lithographically patterning conductive traces 3 defined with high precision. Thus, it is with high precision that a package structure 100 previously optimized in an electromagnetic simulation may thus be transferred to a real package and manufactured.

As far as the manufacturing method is concerned, it shall be noted that the two substrates 1 and 5 are provided in a basic step and are then connected to each other in a further basic step. As a result, flip-chip mounting or face-to-face wafer bonding are suitable; different interconnection techniques such as adhesion or bonding are possible. This is why, in accordance with embodiments, a connecting layer such as an adhesive layer or an insulating adhesive layer or an insulating layer, for example, may be provided only also between the two substrates 1 and 5. Said layer insulates the surfaces 5*o*1 and 1*o*1 from each other at least at the points of contact, or connecting points. As was indicated above, standard semiconductor manufacturing methods may be employed, in accordance with embodiments, for manufacturing the glass substrate and/or the general insulating substrate 1. Thus, with this method, the chip-antenna connection is formed on an insulating substrate. By analogy therewith, the cavity, or the opening, of the second substrate 5 may also be introduced by means of standard manufacturing methods, e.g., dry etching.

A further embodiment will be explained below with reference to FIGS. 2*a* and 2*b*.

Figure 2A:
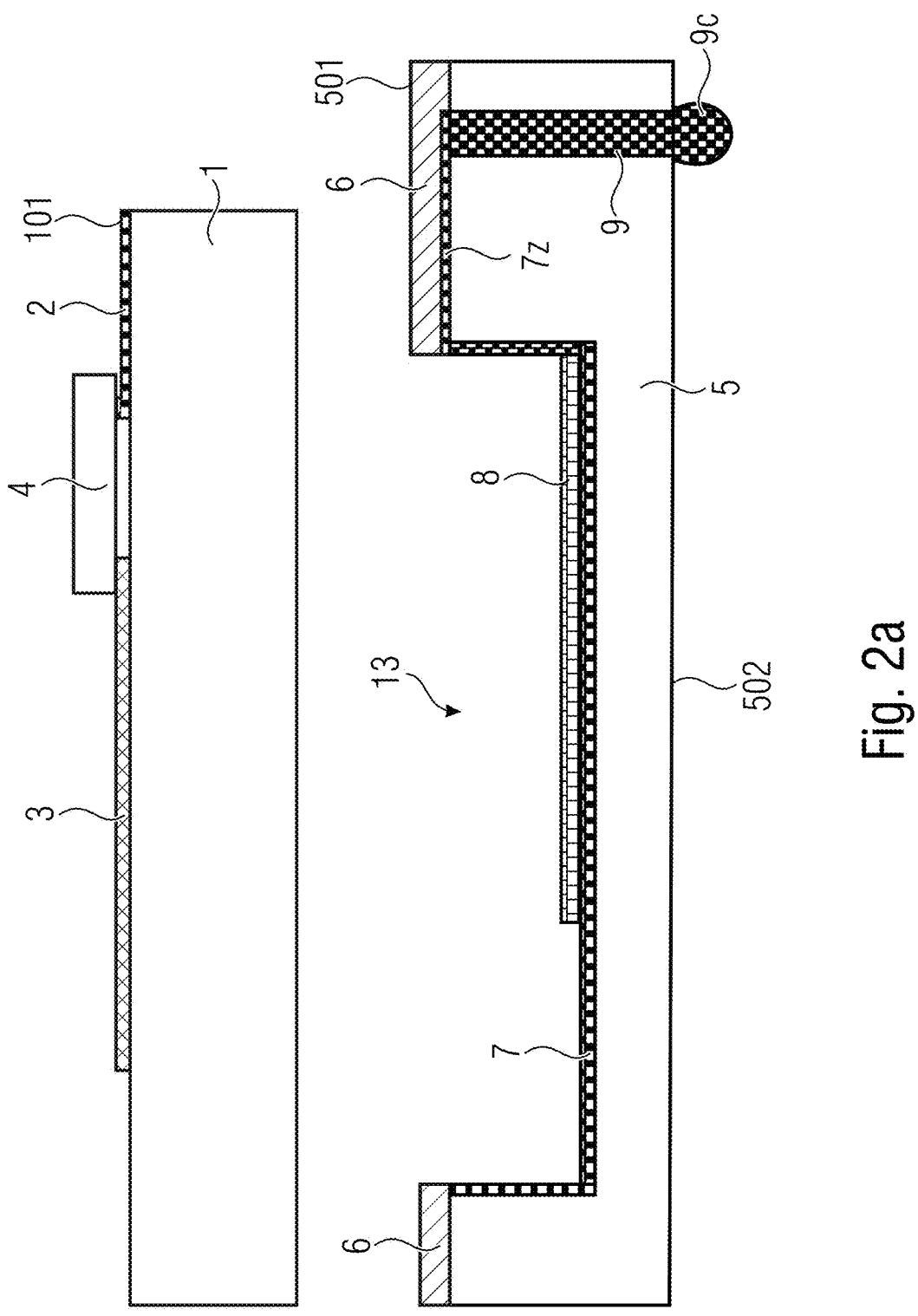
FIG. 2a shows a schematic representation of the device component in cross-section for assembly in accordance with a first extended embodiment.

FIG. 2*a* shows the two substrates 1 and 5, which are still separate from each other. The corresponding main surfaces that are to be connected are designated by reference numerals 5*o*1 and 1*o*1.

In addition to the RF chip 4, the substrate 1 has the RF antenna 3 as well as a feed line 2 applied to its main surface lol.

The substrate 5 comprises a cavity 13. In this embodiment, the cavity 13 is provided with a cavity metallization 7. The vertical walls may have feed lines located thereon. The feed line is designated by the reference numeral 7*z* and connects the cavity metallization 7 to, for example, the electrically conducting via 9. The latter projects from the first main surface 5*o*1 through the entire substrate 5 to the second main surface 502. The second main surface 5*o*2 has a connector element. e.g., in the form of a solder ball 91, provided thereon. As was already mentioned, the cavity metallization 7 is provided on the bottom of the cavity 19. Additionally, a meta material layer 8 may also be arranged on the bottom and/or on the cavity metallization 7. Meta materials are materials whose electrical and magnetic properties (permittivity $\varepsilon_r$ and permeability $\mu_r$) are variably adjustable. This is achieved, for example, by micro- and nano-patterning of conductive and non-conductive, or magnetic, coatings. With regard to the cavity metallization 7 and also to the meta material 8 it shall be noted that both elements may extend across the entire width of the cavity 13 or only across an area of the cavity 13. Here, a variant is shown where the cavity metallization extends across the entire width, and the meta material extends across a reduced width. This means, therefore, that in accordance with embodiments, the cavity metallization 7 may be patterned. For example, the bottom is patterned so as to influence the radiation behavior.

In the design state depicted here in FIG. 2*a*, an insulating layer 6, or an insulating adhesive, is also provided on the first main surface 5*o*1 of the substrate 5. It is via said insulating layer 6, or said insulating adhesive 6, that a connection will then be established to the first main surface 1*o*1, as will become clear with reference to FIG. 2*b*.

Figure 2B:
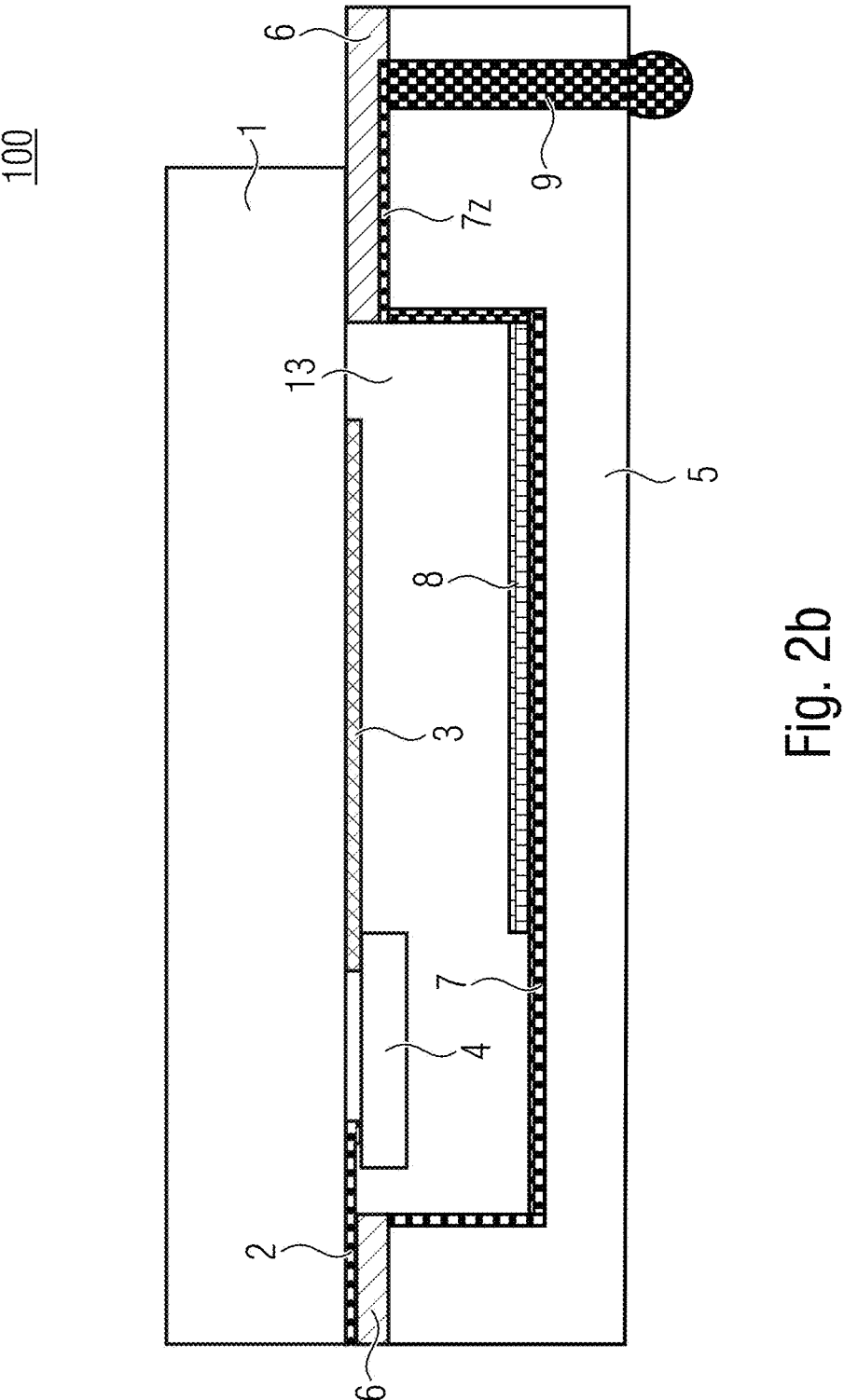

In FIG. 2*b*, the first main surface 1*o*1 of the substrate 1 is connected to the first main surface 5*o*1 of the substrate 5. As was already indicated, the connection is effected via the adhesive layer 6, which covers the entire main surface 5*o*1 here. It shall be noted at this point that the substrate module 1 may be smaller than the substrate module 5, the size being advantageously selected such that at least the cavity 13 is fully covered, or closed off. Said cavity 13 may be filled, e.g., with a gas such as air, for example.

As can be seen, the RF elements 3 and 4 here are laterally arranged in the area of the cavity 13, whereas, e.g., the RF land may overlap the feed line also in the area located next to the cavity. It is within said area that an electrical connection may then be effected. This is not depicted, but projects, e.g., through the insulating material 6. It shall also be noted at this point that the insulating material 6 may be provided in different thicknesses on this side and on the other side of the cavity so as to provide a corresponding height compensation at this point. What is advantageous about this arrangement is that the land for introducing the RF signal, e.g. the connection between 3 and 4, or the element 3, is also geometrically defined. In embodiments, the meta material 8 is provided laterally within the area of the antenna 3. This is why a meta material 8 having a reduced width results.

A further embodiment, wherein the elements 3 and 4 are provided for different cavities 13 and 14, will be explained below with reference to FIGS. 3a and 3b.

Figure 3A:
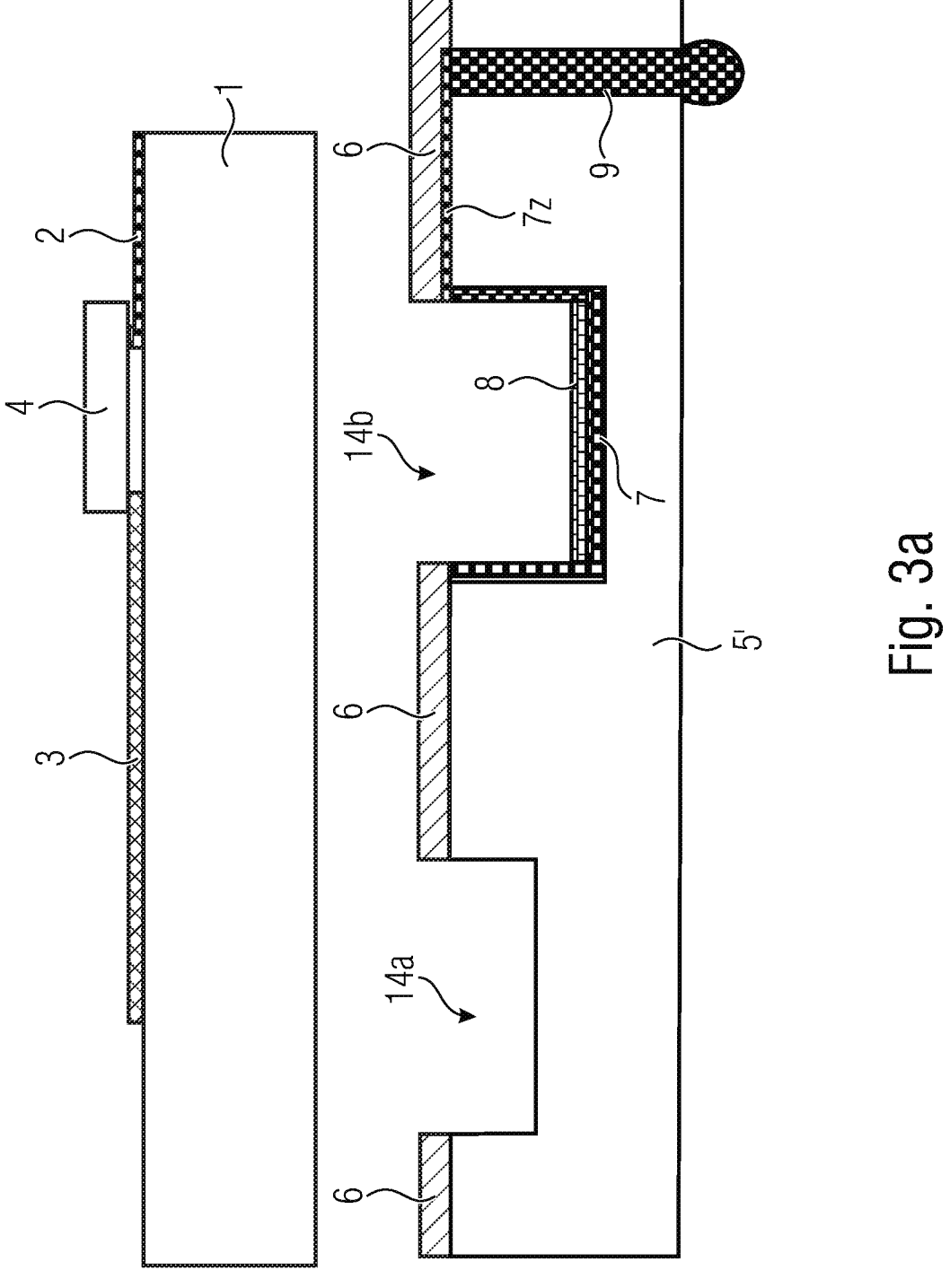
FIGS. 3*a* and 3*b* show schematic representations of device components in cross-section (prior to assembly and following assembly) in accordance with a second extended embodiment.
Figure 3B:
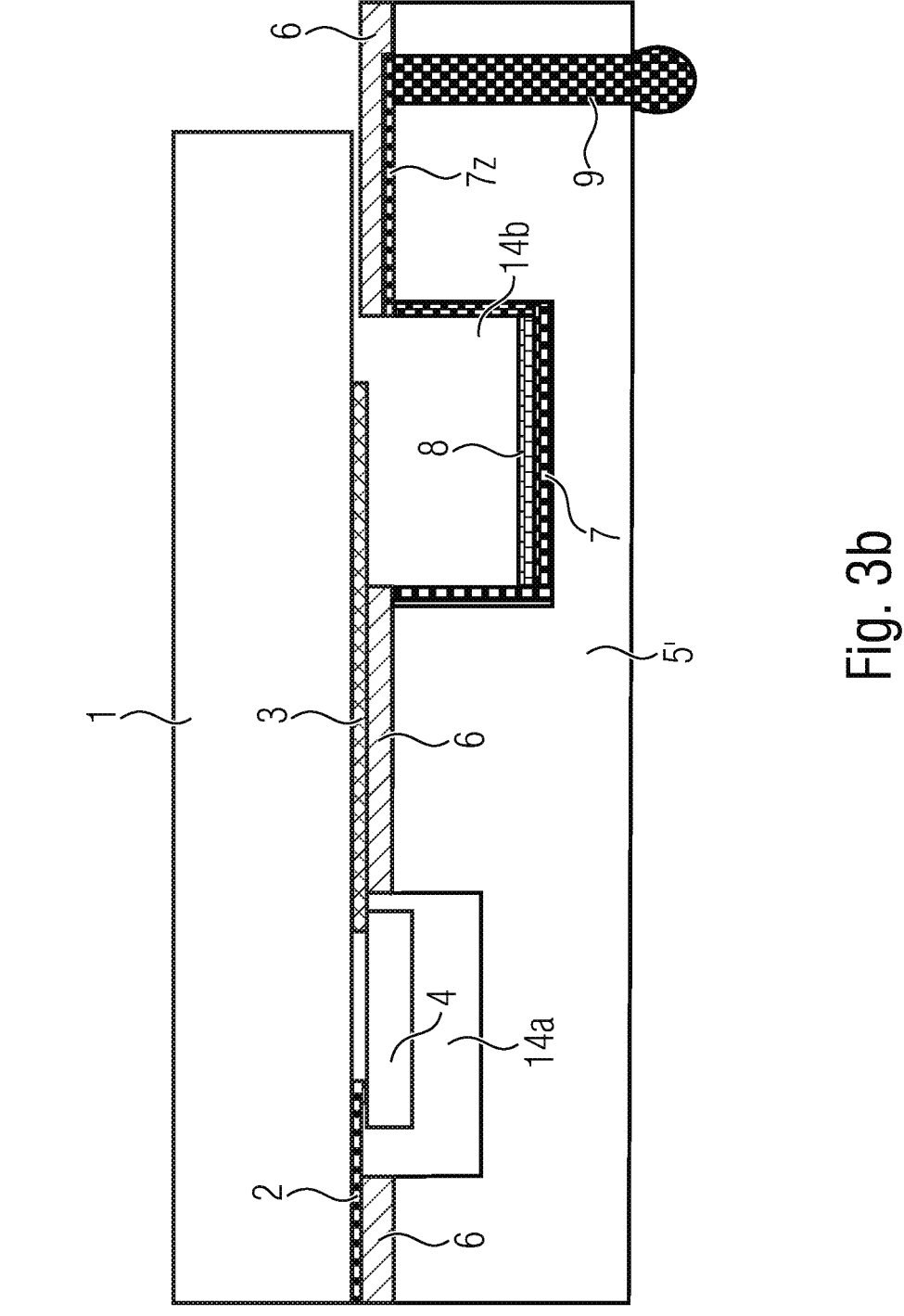

FIG. 3a in turn shows the state wherein the substrates 1 and 5' are still separated from each other. Thus, in this embodiment, the substrate 5' includes two cavities 14a and 14b, the cavity 14a is provided for the chip 4, whereas the cavity 14b is provided for the RF antenna 3. This is why the cavity 14b optionally also includes the meta material 8 on the bottom, or, to be precise, on the cavity metallization 7. The remaining elements such as the feed line 7z or the via 9 or the adhesive layer 6, for example, are comparable to those of the embodiment of FIGS. 2a and 2b.

As depicted here, the depths of the cavities 14a and 14b may vary from each other, in accordance with embodiments. Here, the cavity 14b, which along with the RF antenna element 3 forms the cavity antenna, is formed to be deeper. It is via the depth that, e.g., also RF properties of the cavity antenna are set. The depth of the cavity 14a is selected such that the chip 4 projecting into the cavity 14a has sufficient space or is at least embedded.

The depth of the antenna cavity 14b may be adapted to the desired wavelength of the emitted or received wavelength. In some cases, the depth may amount to a quarter of the target wavelength, i.e., $\lambda/4$, for example. When meta materials are used, different values may be usefully employed for the depth of the cavity. It is an advantage that the inventive implementation enables variability of the cavity depth and that, thus, the performance (among others, energy efficiency) of the system may be optimized.

Figure 4A:
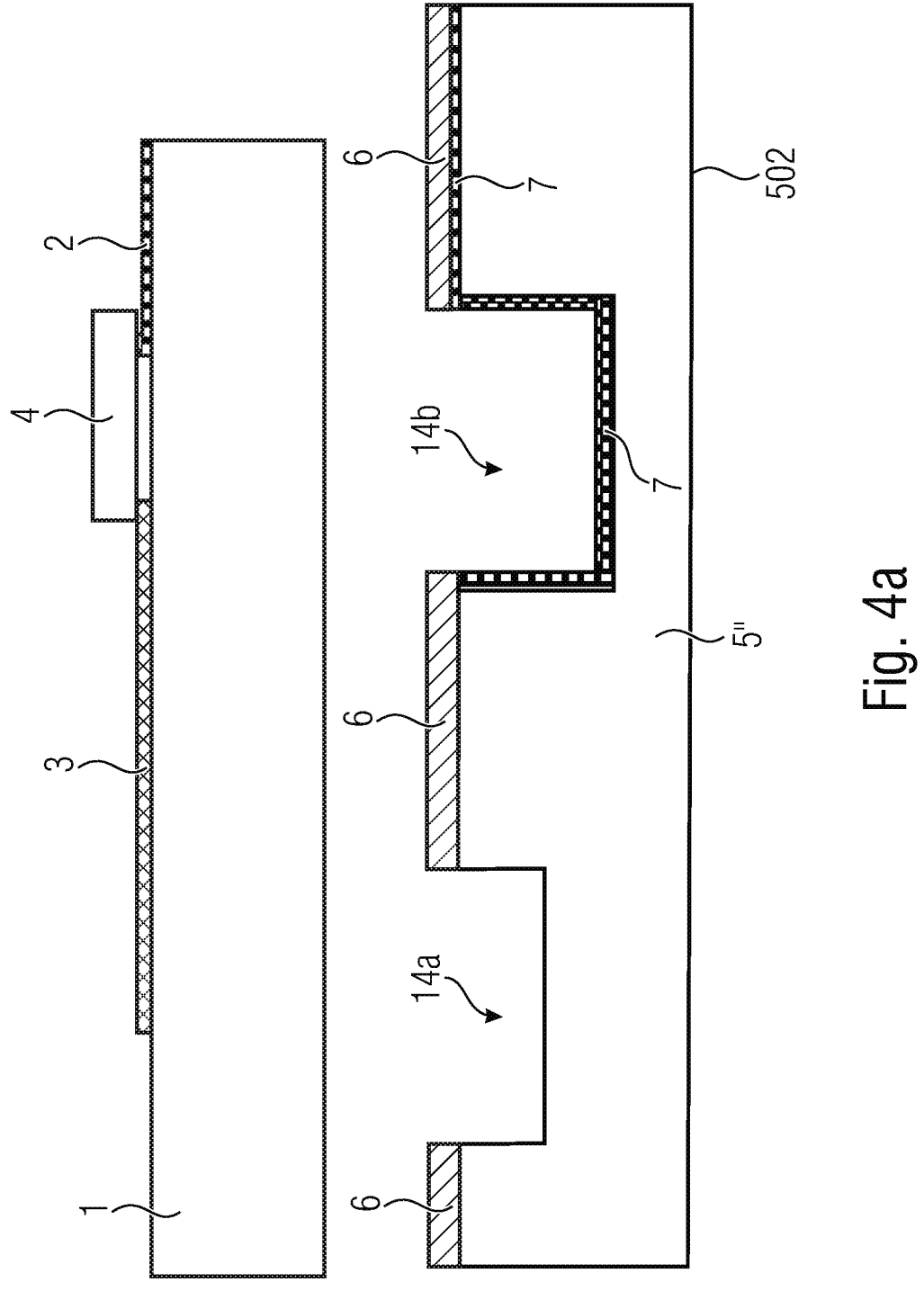
FIGS. 4*a-c* show schematic representations of device components in cross-section (prior to assembly, partially assembled and assembled) in accordance with a third extended embodiment.

With reference to FIG. 4a, an embodiment will now be illustrated wherein the second substrate is configured as a layer stack. In FIG. 4a, the two starting substrates are shown. With regard to its elements 2, 3, 4, the substrate 1 corresponds to the substrate 1 of FIG. 2a or 3a. The substrate 5" is comparable to the substrate 5' of FIG. 3a, the substrate 5" being thinned on the rear side. i.e., starting from the main surface 502. It shall be noted here that thinning of the substrate 5" advantageously is effected when the substrate 5" is connected to the substrate 1 to form a wafer stack (glass+Si). The thinning is effected until the cavity 14a and 14b or at least the cavity of the antenna 14b is open.

Figure 4B:
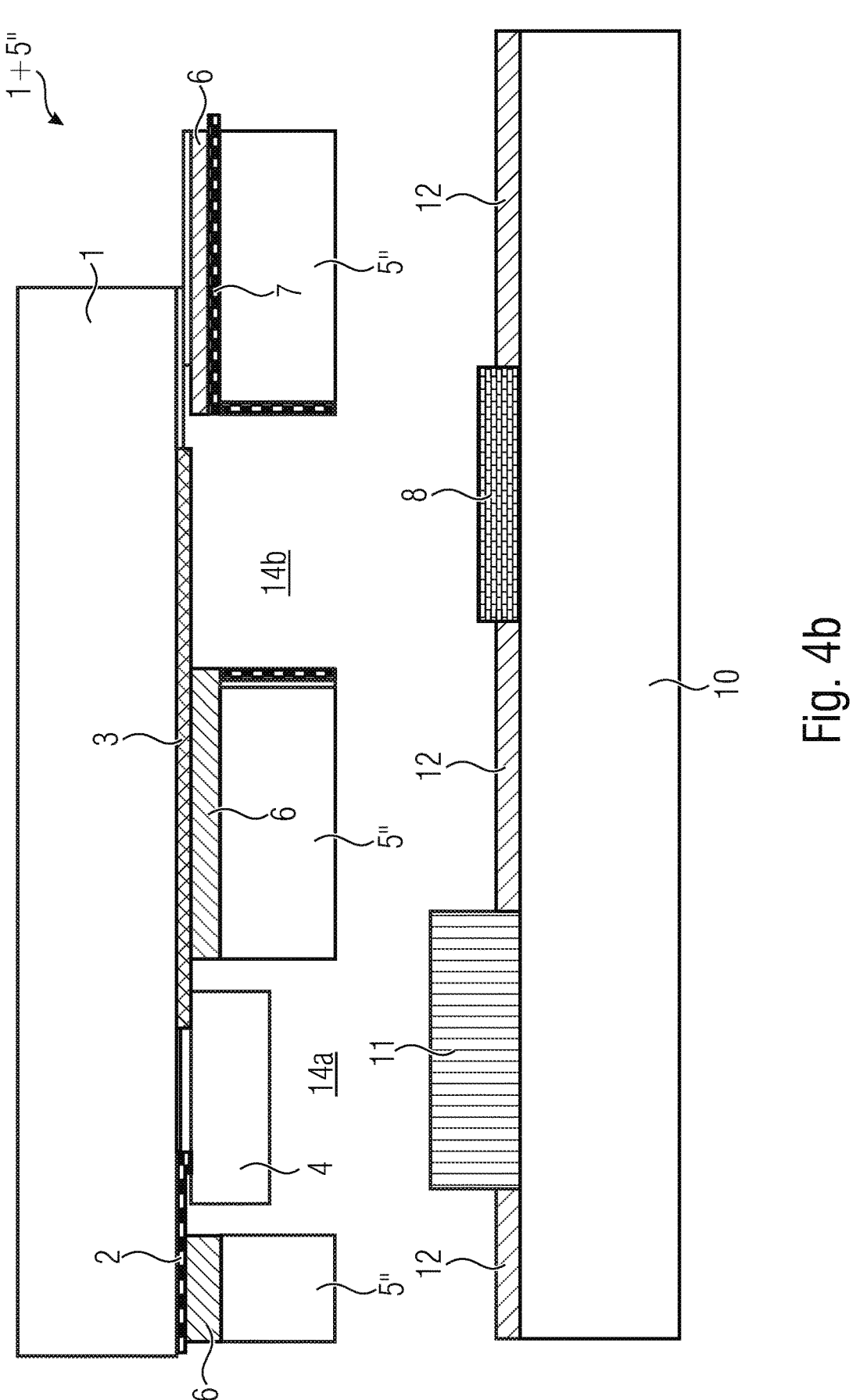

The thinned layer stack is shown in FIG. 4b and provided with the reference numeral 1+5". Following thinning, the two cavities 14a and 14b will be open. The open cavities 14a and 14b may then be closed off with a further substrate 10 such as a further silicon substrate or an insulating substrate, for example. In the embodiment shown here, the further substrate 10 comprises an adhesive layer 12. Elements may additionally be introduced in the area of the cavities 14a and 14b. One example is the meta material 8, already mentioned above, for the cavity 14b that is associated with the RF antenna 3. A further example would be a thermal element 11 in the area of the cavity 14a that is associated with the chip 4. This may establish, e.g., a thermal contact surface with the RFIC so as to improve the cooling surface. In this respect, specific structures for the bottom of the cavities 14a and 14b, e.g., for the antenna may be implemented on this third wafer

Figure 4C:
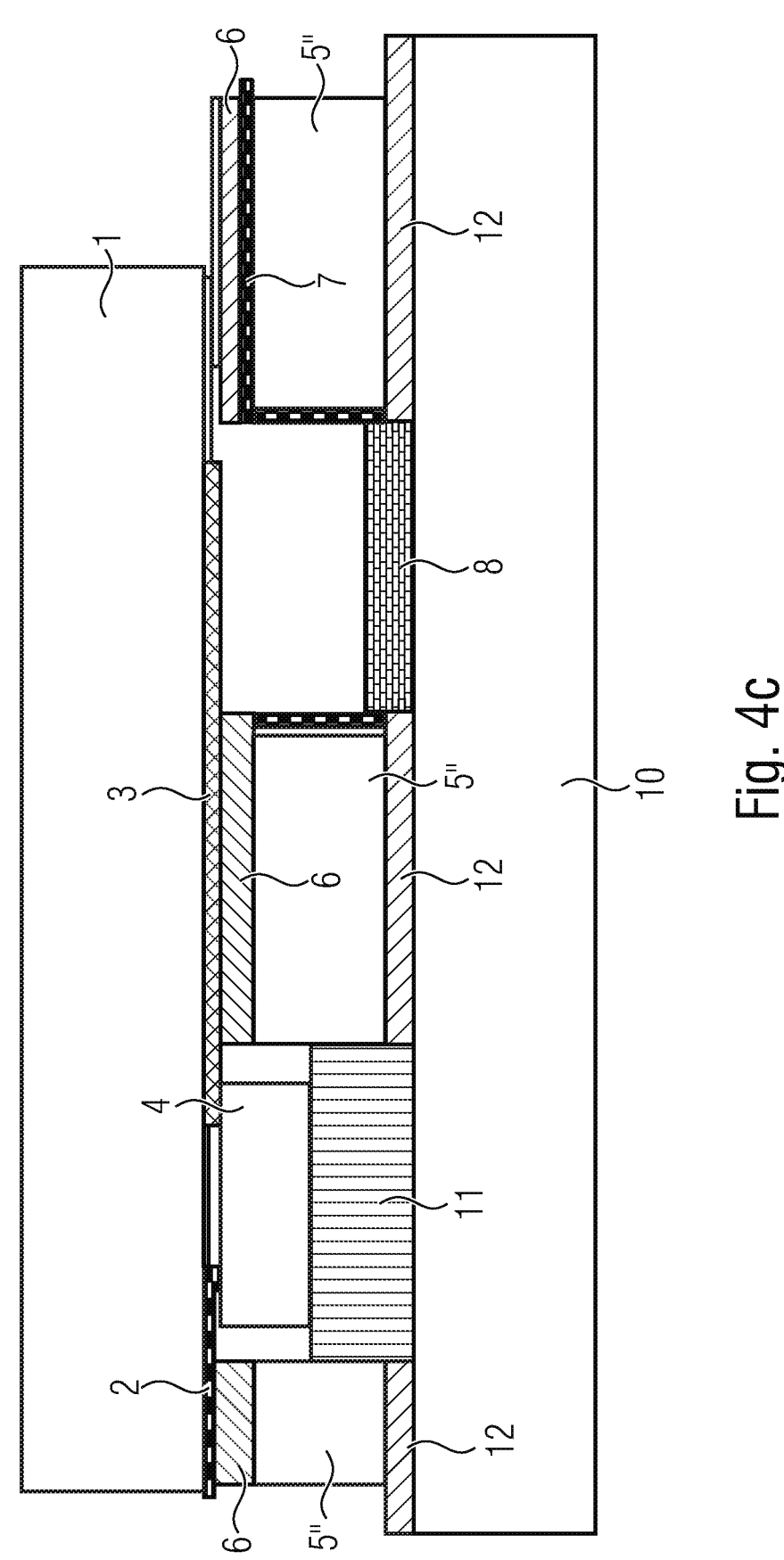

10. In addition to the meta material, other geometrically specifically patterned metal layers may also be provided which ensure further optimization of the cavity antenna 3+14b. Said connection between the cooling element 14 and the chip 4 or the formation of the cavity antenna with the meta material 8 is depicted in FIG. 4c. The entire antenna module is provided with the reference numeral 300.

With regard to the embodiments of FIGS. 4b and 4c, it shall be noted that they disclose the following advantageous structure: a second substrate 5', 5" configured as a layer stack and comprising at least two individual substrates; here, the first one of said at least two individual substrates comprises one or more cavities or openings (from the one main surface to the other main surface), whereas the second one of said at least two individual substrates serves to encapsulate said one or more openings so as to form the one or more cavities. In this respect, combining the first substrate and the second substrate configured as layer stack results in a 3-layer wafer stack. The bottommost wafer 10 in FIGS. 4b and 4c offers the possibility of configuring the patterning of the antenna base (e.g. meta material) in the best quality possible/optimum materiality of a semiconductor wafer technology process. The second wafer is also optimized in terms of conduction and insulation properties. For example, the cavity substrate may insulate; additionally or alternatively, the lid substrate may comprise a metallization for producing the conductive traces/reflectors. By means of the semiconductor manufacturing processes, very fine microstructures may be set so as to optimize the RH properties.

In accordance with the above embodiments, emission of the mm waves is effected through the glass wafer 1. In order to minimize absorption losses within this context, the glass wafer 1 may be thinned/ground off. This, in turn, is possible in a reasonable manner specifically when the glass wafer 1 is stabilized during thinning. This is precisely what the bonded Si wafer 5 achieves within the wafer stack. The thinned glass substrate 1 is a perfect protection against environmental influences (humidity). All contacts are led out to the rear side or to the side via the TSV 9.

With regard to the above embodiments, it shall be noted that the second wafer 5, 5' and/or 5' advantageously consists of silicon; therefore, it offers all of the known patterning techniques of standard semiconductor technology; what is very important for the present case: manufacturing of precisely defined cavities (in the dry etching method) and TSV contacts through the wafer. What is also advantageous is the high thermal conductivity of the Si wafer, which thus enables good heat dissipation from the RF chip. The chip is mounted on the conductive traces by using flip-chip technology: this avoids wire bonds and undesired inductances.

Embodiments of the present invention thus may be characterized as follows: electronic module 100, 200, 300, the electronic module comprising a non-conducting substrate 1 having an electronic component 4 mounted on the first substrate surface and an antenna 3 mounted on the first substrate surface, the electronic module comprising a semiconducting substrate 5 having at least one cavity 13 in a first surface, and the first surface of the non-conducting substrate 1 being connected to the first surface of the semi-conducting substrate 5, so that the electronic component 4 and the antenna 3 project into the at least one cavity or into respectively separate cavities.

The entire package (chip+antenna) arises at the "wafer level", i.e., at low cost with different integrated functionalities of processing and emitting/receiving RF signals. For frequencies above 100 GHz, it becomes particularly advantageous since the dimensions of the antenna now only amount to several millimeters, i.e., since many packages come into being on one wafer at the same time.

The manufacturing method may be described as follows.

providing a non-conducting substrate 1 having an electronic component 4 mounted on the first substrate surface and having an antenna 3, or a conductive-trace structure 3, mounted on the first substrate surface.

providing a substrate 5 (semi-conducting or insulating) having at least one cavity 13 in a first surface connecting the first surface of the non-conducting substrate 1 to the first surface of the semi-conducting substrate 5, so that the electronic component 4 and the antenna 3 project into the at least one cavity or into respectively separate cavities.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. The antenna module, comprising the following features:

a first substrate, a second substrate, said second substrate comprising at least one cavity at a first main surface, wherein the first substrate comprises at least an RF antenna element and an RF chip or an RF conductive trace, the RF antenna element and the RF chip or the RF conductive trace being arranged on or in a first main surface of the first substrate, wherein the RF antenna element and the RF chip or the RF antenna element and the RF conductive trace project out of the first main surface and into the at least one cavity, the first substrate being a high-resistance substrate, an insulating substrate or comprising a glass material, a ceramic material or a polymer material, the cavity comprising an electrically contacted cavity metallization having a pattern;

wherein the antenna module further comprising a meta material being arranged on a bottom of the at least one cavity and coupled to the cavity or being arranged on the cavity metallization and coupled to the cavity metallization;

wherein the meta material and the cavity metallization are—when seen in radiation direction of the RF antenna element—below the RF antenna element and associated with the RF antenna element;

wherein the meta material interacts with the cavity metallization so as to modify the radiation pattern of the RF antenna element through electromagnetic coupling between the metamaterial and the cavity metallization.

2. The antenna module as claimed in claim 1, wherein the first substrate is connected, with its first main surface, to the first main surface of the second substrate.

3. The antenna module as claimed in claim 1, wherein several cavities are provided at the first main surface of the second substrate, which are associated with different RF elements.

4. The antenna module as claimed in claim 1, wherein the second substrate is formed by a substrate stack, or wherein the second substrate is formed by a substrate stack and the substrate stack comprises a substrate or a substrate which acts as a lid element for the cavity.

5. The antenna module as claimed in claim 1, wherein the second substrate comprises a conductive trace, a conductive trace on the first main surface, a conductive trace in the at least one cavity or a conductive trace on a bottom of the at least one cavity.

6. The antenna module as claimed in claim 1, wherein the connection between the first substrate and the second substrate is formed by an adhesive layer, an insulating adhesive layer or an insulating layer.

7. The antenna module as claimed in claim 1, wherein the second substrate comprises one or more vias or one or more vias which project through the second substrate.

8. The antenna module as claimed in claim 1, wherein the second substrate comprises a semiconductor material.

9. The antenna module as claimed in claim 1, wherein the cavity metallization extends across a partial area of the cavity.

10. The antenna module as claimed in claim 1, wherein the first substrate or the second substrate is formed by a thinned substrate.

11. The antenna module as claimed in claim 1, wherein the at least one cavity is filled with air, a gas or a vacuum.

12. The antenna module as claimed in claim 1, wherein the antenna module comprises a thermal element, a thermal element in the at least one cavity, a thermal element arranged on a bottom of the at least one cavity, or a thermal element associated with the RF chip.

13. The antenna module as claimed in claim 1, wherein the second substrate is configured as a layer stack comprising at least two individual substrates; or wherein the second substrate is configured as a layer stack comprising at least two individual substrates; wherein a first one of said at least two individual substrates comprises one or more cavities or one or more openings extending through the first one of the at least two individual substrates, and the second one of the at least two individual substrates serves to encapsulate said one or more openings so as to form the one or more cavities.

14. The antenna module as claimed in claim 1, wherein the meta material comprises electrical and magnetic properties comprising permittivity $\varepsilon_r$ and permeability $\mu_r$, which are dependent on micro- and nano-patterning of conductive and/or non-conductive and/or magnetic coatings.

15. The antenna module as claimed in claim 1, wherein the meta material comprises a micro- and/or nano-patterning of conductive and/or non-conductive and/or magnetic, coatings.

16. The antenna module as claimed in claim 1, wherein the metamaterial and the cavity metallization are distinct electromagnetic structures arranged within the cavity and electromagnetically coupled to one another.

\* \* \* \* \*